(12) United States Patent
Kondoh et al.

(10) Patent No.: US 9,960,714 B2
(45) Date of Patent: May 1, 2018

(54) POWER GENERATING ELEMENT (71) Applicants: Tsuneaki Kondoh, Kanagawa (JP); Tomoaki Sugawara, Kanagawa (JP); Mayuka Araumi, Tokyo (JP); Yuko Arizumi, Kanagawa (JP); Mizuki Otagiri, Kanagawa (JP); Junichiro Natori, Kanagawa (JP); Megumi Kitamura, Tokyo (JP); Takahiro Imai, Tokyo (JP); Hideyuki Miyazawa, Kanagawa (JP); Makito Nakashima, Kanagawa (JP)

(72) Inventors: Tsuneaki Kondoh, Kanagawa (JP); Tomoaki Sugawara, Kanagawa (JP); Mayuka Araumi, Tokyo (JP); Yuko Arizumi, Kanagawa (JP); Mizuki Otagiri, Kanagawa (JP); Junichiro Natori, Kanagawa (JP); Megumi Kitamura, Tokyo (JP); Takahiro Imai, Tokyo (JP); Hideyuki Miyazawa, Kanagawa (JP); Makito Nakashima, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days. days.

(21) Appl. No.: 15/397,104

(22) Filed: Jan. 3, 2017

(65) Prior Publication Data
US 2017/0207729 A1    Jul. 20, 2017

(30) Foreign Application Priority Data

Jan. 15, 2016 (JP) .................................. 2016-006529

(51) Int. Cl.
*H01L 41/113* (2006.01)
*H02N 2/18* (2006.01)
*F03G 5/00* (2006.01)

(52) U.S. Cl.
CPC ................. *H02N 2/18* (2013.01); *F03G 5/00* (2013.01)

(58) Field of Classification Search
CPC .............................. H02N 2/18; H01L 41/113
(Continued)

(56) References Cited

U.S. PATENT DOCUMENTS 6,940,211 B2 * 9/2005 Pelrine .................... F04B 35/00
310/330
7,812,508 B2 * 10/2010 Abramovich ........... E01B 26/00
310/339
(Continued)

FOREIGN PATENT DOCUMENTS

JP    2002-218769    8/2002
JP    2003-033050    1/2003
(Continued)

OTHER PUBLICATIONS

Extended European Search Report dated Jun. 12, 2017 in European Patent Application No. 16203344.3.

*Primary Examiner* — J. San Martin
(74) *Attorney, Agent, or Firm* — Oblon, McClelland, Maier & Neustadt, L.L.P.

(57) ABSTRACT

A power generating element is provided. The power generating element includes a piezoelectric body and a pair of electrodes. The piezoelectric body is expandable and contractible in response to a movement of a moving body. The piezoelectric body undergoes a deformation when expanding or contracting and generates power when undergoing the deformation. The pair of electrodes extracts the power generated as the piezoelectric body undergoes the deformation.

6 Claims, 9 Drawing Sheets

(58) Field of Classification Search
USPC .......................................................... 310/339
See application file for complete search history.

(56) References Cited

U.S. PATENT DOCUMENTS

| | | | |
|---|---|---|---|
| 7,936,109 B1 * | 5/2011 | Gao | H02N 2/186 310/329 |
| 2001/0035723 A1 * | 11/2001 | Pelrine | F02G 1/043 318/116 |
| 2012/0133247 A1 | 5/2012 | Lee et al. | |
| 2013/0265003 A1 | 10/2013 | Wei et al. | |
| 2015/0008798 A1 | 1/2015 | Kato et al. | |
| 2016/0276957 A1 | 9/2016 | Sugawara et al. | |
| 2016/0328066 A1 | 11/2016 | Kondoh et al. | |
| 2016/0336505 A1 | 11/2016 | Arizumi et al. | |
| 2016/0341381 A1 | 11/2016 | Imai et al. | |
| 2016/0344309 A1 * | 11/2016 | Otagiri | H02N 2/18 |
| 2016/0351771 A1 * | 12/2016 | Schneider | H01L 35/28 |
| 2017/0029985 A1 * | 2/2017 | Tajitsu | D03D 15/00 |

FOREIGN PATENT DOCUMENTS

| | | | |
|---|---|---|---|
| JP | 2013-099130 | 5/2013 | |
| KR | 10-2012-0133581 A | 12/2012 | |
| KR | 10-2013-0024224 A | 3/2013 | |
| WO | WO 2012136842 A1 * | 10/2012 | ........... A43B 1/0054 |

\* cited by examiner

POWER GENERATING ELEMENT

CROSS-REFERENCE TO RELATED APPLICATION

This patent application is based on and claims priority pursuant to 35 U.S.C. § 119(a) to Japanese Patent Application No. 2016-006529, filed on Jan. 15, 2016 in the Japan Patent Office, the entire disclosure of which is hereby incorporated by reference herein.

BACKGROUND

Technical Field

The present disclosure relates to a power generating element.

Description of the Related Art

There have been attempts to convert vibration energy into electric energy. Vibration energy is generally generated from vibrations caused by structural bodies (e.g., roads, bridges, buildings, and industrial machineries), moving bodies (e.g., automobiles, railroad cars, and aircraft), and human body movements, and from environmental vibrations (e.g., wave power, wind power).

A vibration power generating device has been proposed including an elastic sheet deformable by a vibration load, a piezoelectric film disposed on a surface of the elastic sheet, and electrodes disposed on both surfaces of the piezoelectric film. This power generating device generates power as the elastic sheet undergoes a deformation and the piezoelectric film then undergoes a distortion by a stretching or compressing force.

The piezoelectric film is made of PVDF (polyvinylidene fluoride) that is one type of polymer piezoelectric bodies.

Owing to their flexibility, such polymer piezoelectric bodies (including PVDF) have wider application compared to ceramic piezoelectric bodies having a higher hardness.

SUMMARY

In accordance with some embodiments of the present invention, a power generating element is provided. The power generating element includes a piezoelectric body and a pair of electrodes. The piezoelectric body is expandable and contractible in response to a movement of a moving body. The piezoelectric body undergoes a deformation when expanding or contracting and generates power when undergoing the deformation. The pair of electrodes extracts the power generated as the piezoelectric body undergoes the deformation.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

The accompanying drawings are intended to depict example embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Embodiments of the present invention are described in detail below with reference to accompanying drawings. In describing embodiments illustrated in the drawings, specific terminology is employed for the sake of clarity. However, the disclosure of this patent specification is not intended to be limited to the specific terminology so selected, and it is to be understood that each specific element includes all technical equivalents that have a similar function, operate in a similar manner, and achieve a similar result.

For the sake of simplicity, the same reference number will be given to identical constituent elements such as parts and materials having the same functions and redundant descriptions thereof omitted unless otherwise stated.

The polymer piezoelectric bodies are applicable to wearable power generating devices that generate power using human body movements. When applied to wearable power generating devices, however, the polymer piezoelectric body can deform only within the possible range of distortion of the material composing the polymer piezoelectric body, although having flexibility.

In other words, the polymer piezoelectric body can follow a simple bending movement of a human body, but can merely stretch to the extent that the material thereof can get distorted, in the direction parallel to the plane surface thereof. As an example, when applied to a garment, the polymer piezoelectric body cannot follow a three-dimensional deformation caused at an elbow part of the garment by a bending movement of an arm, bringing an uncomfortable feeling to the wearer.

If the polymer piezoelectric body can follow such a three-dimensional deformation, it would be possible to increase the electrode area and thus increase the amount of power generated. However, conventional polymer piezoelectric bodies have difficulty in following such a three-dimensional deformation and can deform only within the possible range of distortion of the material composing the polymer piezoelectric body, thereby limiting the amount of power generated. Thus, conventional polymer piezoelectric bodies cannot be expected to generate a greater amount of power even when using various human movements as energy source, compared to a case of using simple bending movements as energy source.

While conventional power generating devices mainly use environmental vibrations as energy source, there are various energy sources other than environmental vibrations.

For example, in addition to a bending movement of a human arm or leg as described above, a bending or stretching movement of an assembling robot in a production line, as well as a linear reciprocating movement of the shaft of the assembling robot, can be energy sources.

Since conventional polymer piezoelectric bodies can deform only within the possible range of distortion of the material composing the polymer piezoelectric body, expanding/contracting movements, such as bending, stretching, and linear reciprocating movements, have not attracted attention as power generating energy sources.

In accordance with some embodiments of the present invention, a power generating element is provided which can utilize expanding/contracting movements, including bending, stretching, and linear reciprocating movements, caused in the human body or environment, as power generating energy sources.

Figure 1A:
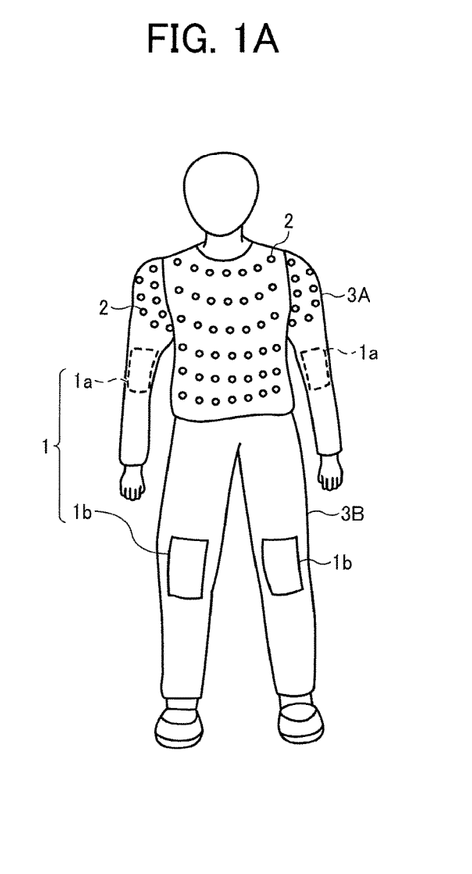
FIGS. 1A and 1B are perspective views of a power generating device according to a first embodiment of the present invention, in an undeformed state and a deformed state, respectively.

A first embodiment of the present invention is described below with reference to FIGS. 1A-1B, 2A-2B, 3A-3B, 4A-4B, and 5. Referring to FIG. 1A, a power generating device 1 according to an embodiment of the present invention is disposed on multiple parts on an illumination jacket 3A, to which multiple LEDs (light emitting diodes) 2 are attached, and pants 3B.

In particular, the power generating device 1 includes power generating devices 1a disposed on both elbow parts of the illumination jacket 3A and power generating devices 1b disposed on both knee parts of the pants 3B.

The power generating devices 1a and 1b are secured to the illumination jacket 3A and the pants 3B, respectively. Specifically, the periphery of each of the power generating devices 1a and 1b is sewn on the cloth of the illumination jacket 3A and the pants 3B with a thread. The power generating devices 1a and 1b may be disposed on the back surface of the illumination jacket 3A and the pants 3B to become invisible from an outside. Alternatively, the power generating devices 1a and 1b may be detachably attached to the illumination jacket 3A and the pants 3B via hook-and-loop fasteners.

Figure 1B:
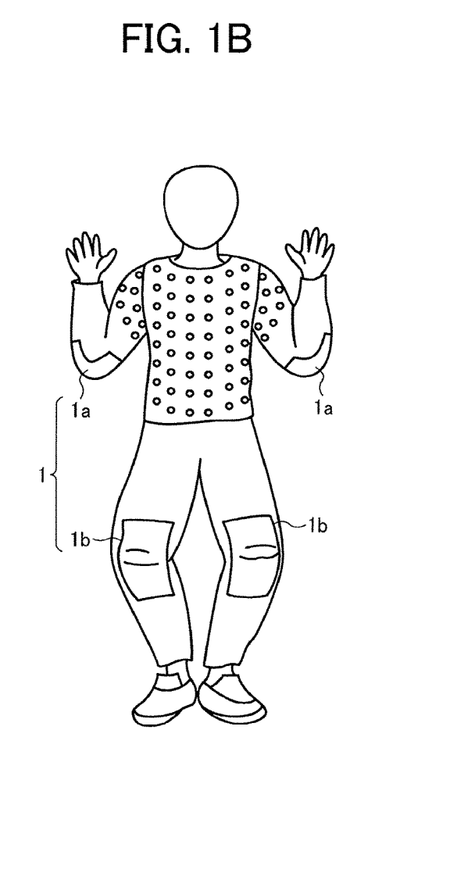
Figure 2A:
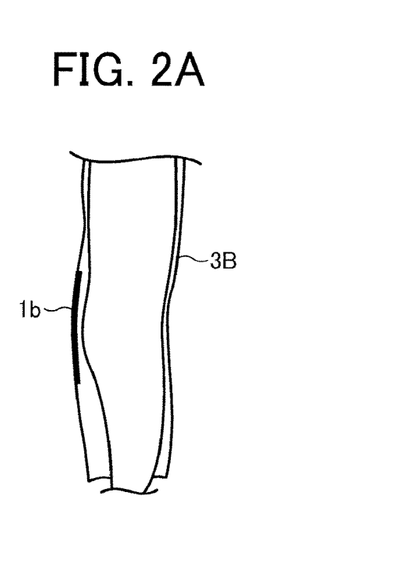
FIGS. 2A and 2B are partial magnified views of FIGS. 1A and 1B, in an undeformed state and a deformed state, respectively.
Figure 2B:
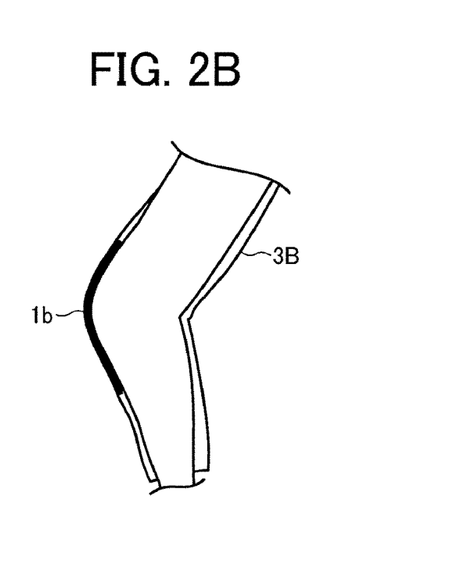

Referring to FIG. 1B, when an expanding/contracting movement (such as bending, stretching, and linear reciprocating movements) is caused in a human arm or leg, serving as a moving body, the power generating device 1a or 1b undergoes a deformation. Specifically, when the leg in the state illustrated in FIG. 2A is bent, the power generating device 1b deforms along a protrusion of the knee as illustrated in FIG. 2B.

Figure 3A:
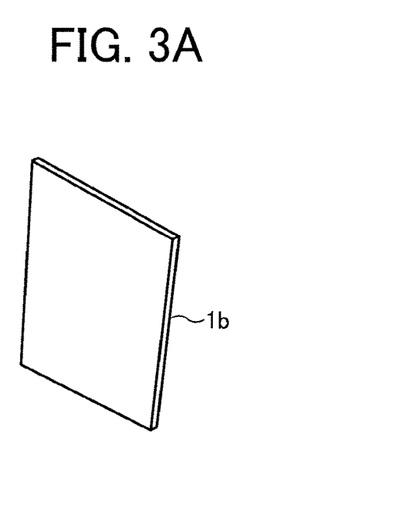
FIGS. 3A and 3B are perspective views of the power generating device illustrated in FIGS. 1A and 1B, in an undeformed state and a deformed state, respectively.
Figure 3B:
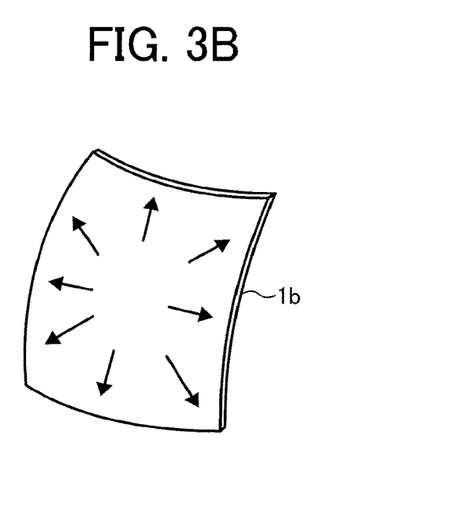

The power generating device 1b is in the form of a sheet having a specific area, as illustrated in FIG. 3A. When undergoing a deformation, the power generating device 1b stretches in all directions parallel to its plane surface, thus three-dimensionally deforming following the shape of the knee. When the leg in the state illustrated in FIG. 2B is stretched, the power generating device 1b returns to the state illustrated in FIG. 2A owing to a restoring force generated by its elasticity. The power generating device 1a operates in the same manner as the power generating device 1b when undergoing a deformation.

Figure 4A:
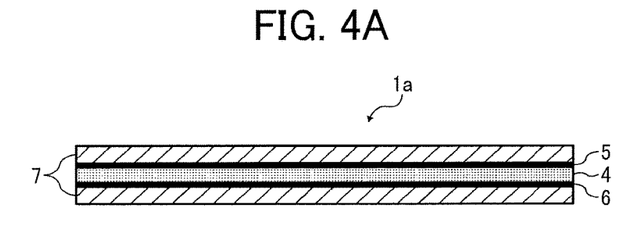
FIGS. 4A and 4B are cross-sectional views of the power generating device illustrated in FIGS. 1A and 1B, in an undeformed state and a deformed state, respectively.

Referring to FIG. 4A, the power generating device 1a includes an intermediate layer 4, serving as a piezoelectric body, and an electrode pair including a first electrode 5 and a second electrode 6. The intermediate layer 4 is expandable and contractible in response to a movement of a moving body. The intermediate layer 4 undergoes a deformation when expanding or contracting, and generates power when undergoing the deformation. The electrode pair extracts the power (charge) generated when the intermediate layer 4 undergoes the deformation.

The first electrode 5 is in contact with one side of the intermediate layer 4 at least in part. The second electrode 6 is in contact with the other side of the intermediate layer 4 at least in part. The power generating device 1a has a laminated structure in which the intermediate layer 4 is sandwiched by the first electrode 5 and the second electrode 6 in the thickness direction of the intermediate layer 4.

The first electrode 5 and the second electrode 6 are made of a conductive rubber. The outer surfaces of the first electrode 5 and the second electrode 6 are each covered with a rubber sheet 7 having flexibility. The rubber sheet 7 serves as a deformable cover member deformable along with the deformation of the intermediate layer 4.

The power generating device 1b has the same configuration as the power generating device 1a.

Figure 4B:
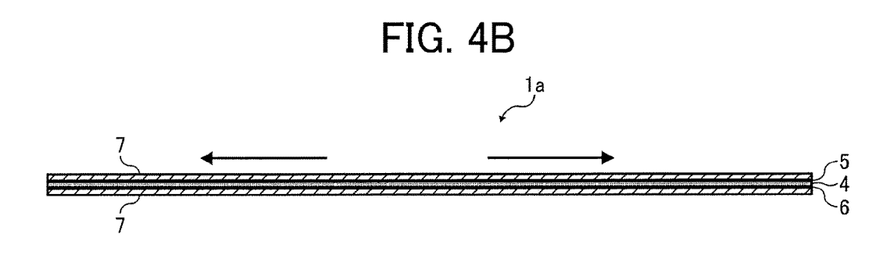

FIG. 4B illustrates the power generating device 1a in an expanded state. The power generating device 1a expands or contacts as the elbow moves. The power generating device 1b expands or contacts as the knee moves.

The power generating devices 1a and 1b expand or contact as the material composing the piezoelectric body and that composing the electrodes expand or contract.

Figure 5:
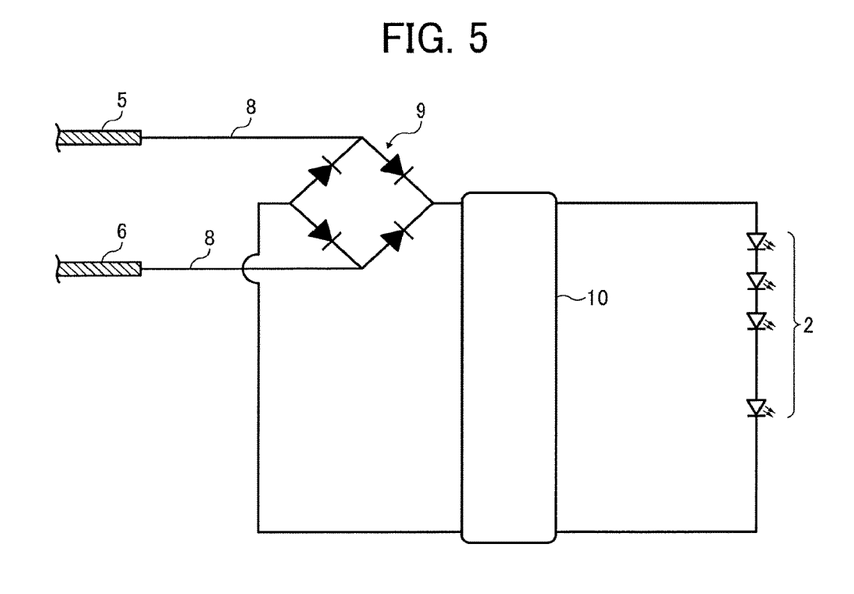
FIG. 5 is a circuit diagram for lightening LEDs in a power generating device according to an embodiment of the present invention.

Referring to FIG. 5, a charge generated in the power generating device 1a is introduced to a diode bridge 9, serving as a rectifier, via the first electrode 5, the second electrode 6, and wires 8. The charge is converted into a current flowing in a specific direction in the diode bridge 9, and multiple LEDs 2 are lighted up by the current.

As illustrated in FIG. 5, an LED driving circuit 10 for controlling lighting or blinking of the LEDs 2 may be added to the circuit.

A charge generated in the power generating device 1b is treated in the same manner as described above.

In the present embodiment, the power generating device 1 is disposed on a part of the surface of the illumination jacket 3A and the pants 3B. Alternatively, the power generating device 1 may be disposed on the entire surface of the illumination jacket 3A and the pants 3B.

Each of the first electrode 5 and the second electrode 6 may be either bonded or unbonded to the intermediate layer 4. Alternatively, each of the first electrode 5 and the second electrode 6 may be partially bonded to the intermediate layer 4.

The intermediate layer 4 includes a rubber and/or rubber composition that is expandable and contractible sufficient for undergoing an extremely large deformation in excess of a general degree of distortion. One side of the intermediate layer 4 in the lamination direction has been subjected to a surface modification treatment and/or an inactivation treatment, such that the one side and the other side of the intermediate layer 4 deform to different degrees of deformation when the same deformation imparting force is applied thereto, and that the one side becomes capable of storing charge.

At an unbonded portion of the first electrode 5 and/or the second electrode 6 with the intermediate layer 4, when a deformation is caused, triboelectric charge or peeling charge occurs between the intermediate layer 4 and the electrode to store a charge, and a change in capacitance is generated between the intermediate layer 4 and the electrode to generate power. At a bonded portion of the first electrode 5 and/or the second electrode 6 with the intermediate layer 4, when a deformation is caused, a change in capacitance is generated between the intermediate layer 4 and the electrode to generate power.

The power generating device 1 generates power when either expanding or contracting, based on the above-described mechanism.

The power generating device 1 according to the present embodiment expands or contracts in response to a movement of a moving body, and undergoes a deformation. The deformation is a large stretching deformation for stretching in a direction parallel to the plane surface of the power generating device, which occurs beyond the possible range of distortion of a related-art polymer piezoelectric body.

Such a stretching deformation is capable of increasing the electrode area per unit installation area, thus drastically increasing the amount of power generated.

In addition, a person wearing the illumination jacket 3A and the pants 3B will feel less uncomfortable since the power generating device 1 expands or contracts along with the movement of the person.

The intermediate layer 4 includes a silicone rubber that has been subjected to a surface modification treatment and an inactivation treatment. Owing to the surface modification treatment, both sides of the intermediate layer 4, respectively facing the first electrode 5 and the second electrode 6, deform to different degrees of deformation when the same deformation imparting force is applied thereto. In other words, one side of the intermediate layer 4 is different from the other side thereof in terms of hardness. This property improves power generating efficiency of the power generating device 1.

Thus, the power generating device 1 according to the present embodiment can generate an increased amount of power owing to both the increased electrode area and the increased power generating efficiency caused by the surface modification treatment of the intermediate layer 4.

In the present embodiment, the power generating device 1 is applied to the illumination jacket 3A to be worn by a dance performer in the entertainment field. Alternatively, the power generating device 1 may be applied to an LED jacket to be worn by a security guard in working sites to be used as a power source for the LED.

Alternatively, the power generating device 1 may also be used as a power source of wearable terminals.

Moreover, the power generating device 1 may be attached to a golf wear to be used as a sensor for monitoring the movement of the wearer, by monitoring the variation in voltage. When used as the sensor, an improvement in power generating efficiency contributes to an improvement in sensitivity of the sensor.

A second embodiment of the present invention is described below with reference to FIGS. 6A-6B and 7A-7B. For the sake of simplicity, the same reference number will be given to identical constituent elements such as parts and materials having the same functions and redundant descriptions thereof omitted unless otherwise stated.

In the second embodiment, energy for generating power is extracted from repeating motion of robots.

Figure 6A:
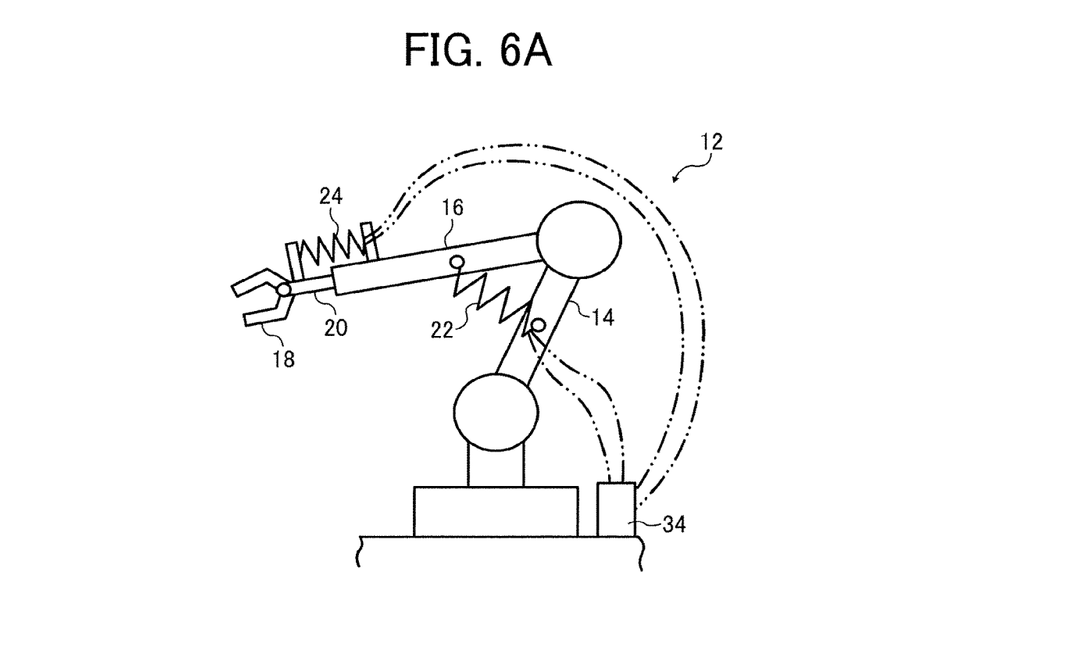
FIGS. 6A and 6B are perspective views of a power generating device according to a second embodiment of the present invention, in an undeformed state and a deformed state, respectively.
Figure 6B:
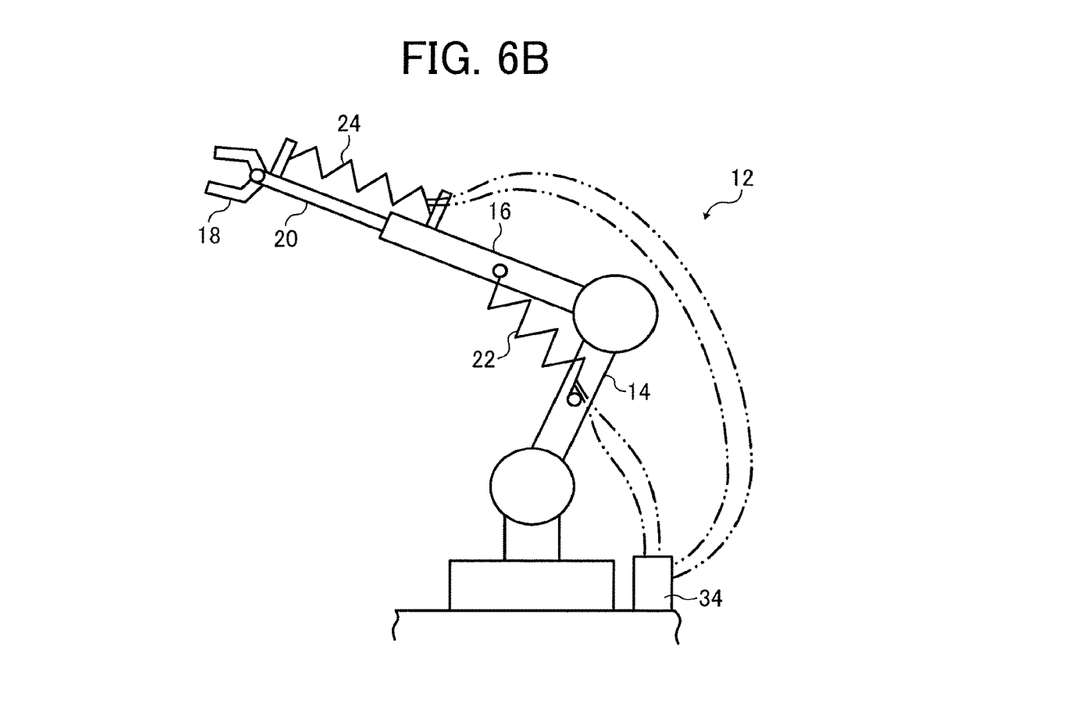

FIGS. 6A and 6b are schematic views of a part transfer robot 12, serving as the moving body, in a production line. The part transfer robot 12 includes a link 14 and an arm 16. A shaft 20 having a gripper 18 is disposed on the arm 16 so as to be reciprocally movable in a linear manner with respect to the arm 16.

A power generating device 22 is disposed between the link 14 and the arm 16. A power generating device 24 is disposed between the arm 16 and the shaft 20.

Figure 7A:
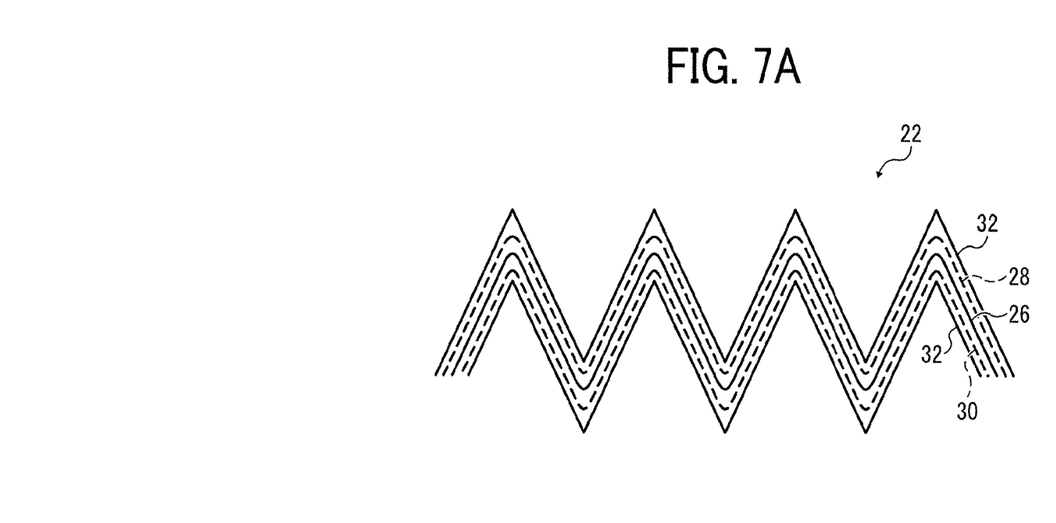
FIGS. 7A and 7B are cross-sectional views of the power generating device illustrated in FIGS. 6A and 6B, in an undeformed state and a deformed state, respectively.

Referring to FIG. 7A, the power generating device 22 is in an accordion shape having continuous bent parts, even when the moving body (the part transfer robot 12) does not act thereon. In addition, the power generating device 22 as a whole has flexibility.

The power generating device 22 has a laminated structure in which a piezoelectric body 26, a first electrode 28, a second electrode 30, and a pair of cover members 32 are laminated as illustrated in FIG. 7A. The piezoelectric body 26 is a flexible sheet. The first electrode 28 and the second electrode 30 have flexibility. The first electrode 28 and the second electrode 30 are disposed facing respective sides of the piezoelectric body 26 in the thickness direction. The cover members 32 cover the respective outer surfaces of the first electrode 28 and the second electrode 30.

Each cover members 32 is made of a PET (polyethylene terephthalate, one of thermoplastic resins) film that has been accordion-folded. The cover member 32 remains in an accordion shape (hereinafter "first shape") even when the moving body does not act thereon. The cover member 32 as a whole is elastically deformable.

Figure 7B:
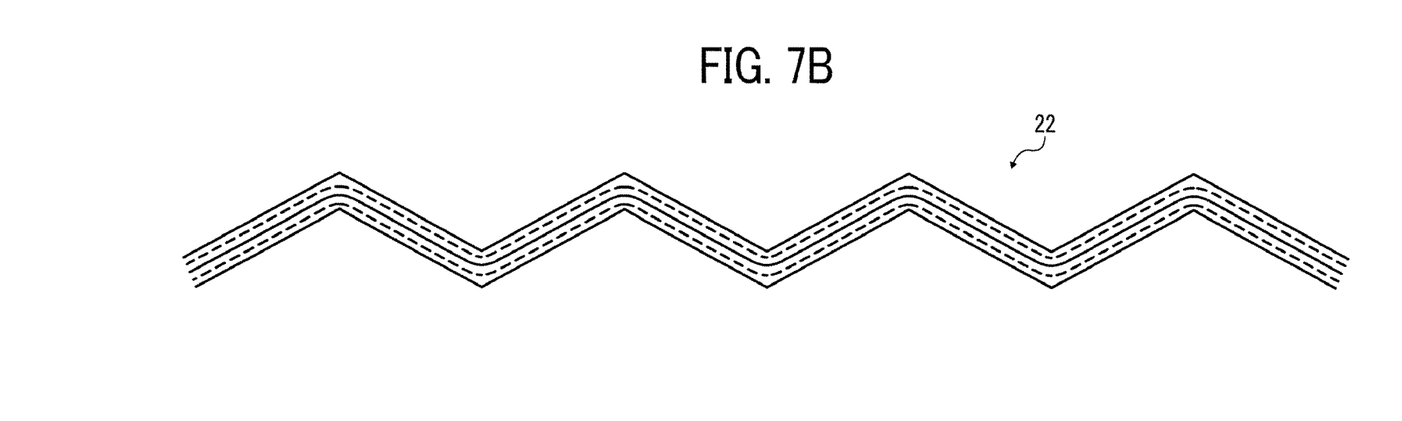

As the part transfer robot 12 moves so as to extend the gap between the link 14 and the arm 16 as illustrated in FIG. 6B, the power generating device 22 transitions to a second shape illustrated in FIG. 7B, in which the accordion part is stretched to widen the angle of bending of each bent part, thereby generating power.

A charge generated in the power generating device 22 is stored as electric energy in a storage device 34 equipped with a rectifier (e.g., bridge diode) and a storage body. The stored electric energy is used for other electric apparatus.

The piezoelectric body 26 has the same configuration as the intermediate layer 4 used in the first embodiment, but the configuration of the piezoelectric body 26 is not limited thereto.

In the present embodiment, an expansion or contraction of the piezoelectric body 26 is caused by a change in bent condition, in other words, a reversible change in shape between the first shape and the second shape. The piezoelectric body 26 has flexibility sufficient for following a deformation of the cover member 32, but need not stretch in the direction parallel to the plane surface thereof.

Thus, the piezoelectric body 26 may be made of PVDF that is only stretchable within the possible range of distortion thereof.

The power generating device 22 generates power when either expanding or contracting. The power generating device 24 operates in the same manner as the power generating device 22. The power generating devices 22 and 24 are both capable of generating power using human body movements.

The power generating devices 22 and 24 are forcibly restricted in movement by the movement of the part transfer robot 12. Therefore, the cover member 32 need not necessarily be elastically deformable as a whole. However, when having a restoring force for returning to a previous state, the cover member 32 can be advantageously used in a case in which a force in a specific direction is intermittently acts thereon.

A third embodiment of the present invention is described below with reference to FIGS. 8A and 8B.

Figure 8A:
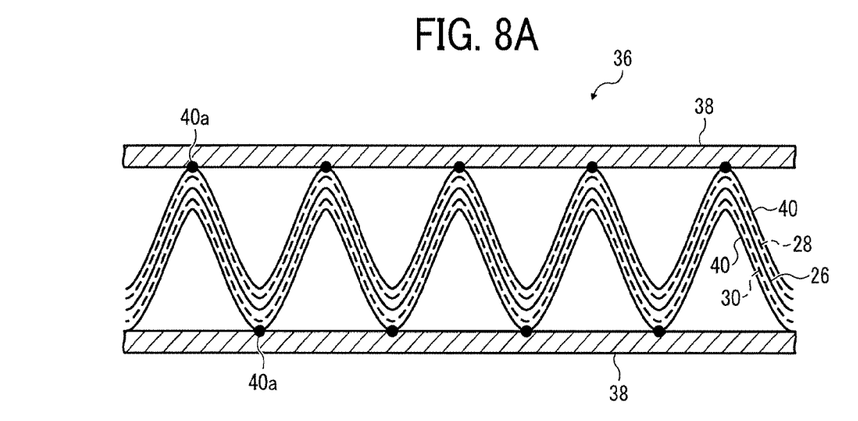
FIGS. 8A and 8B are cross-sectional views of a power generating device according to a third embodiment of the present invention, in an undeformed state and a deformed state, respectively.

Referring to FIG. 8A, a power generating device 36 according to the third embodiment further includes a pair of rubber sheets 38 and a pair of cover members 40. The rubber sheet 38 is an elastic support being expandable and contractible. The cover member 40 is an intermediate support intermittently secured to the rubber sheet 38 in the direction of expansion and contraction. The cover member 40 is made of a PET film, but the material of the cover member 40 is not limited thereto.

Figure 8B:
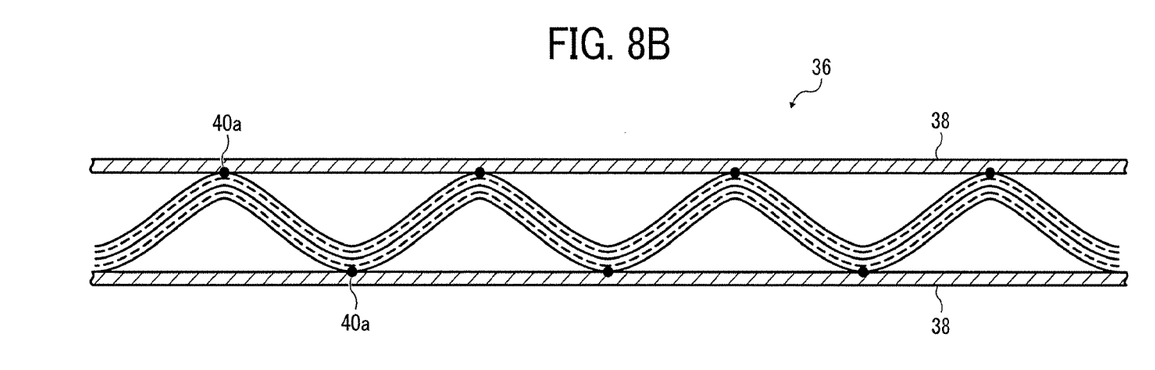

The rubber sheet 38 is stretched as the moving body moves, as illustrated in FIG. 8B, thus extending the distance between fixed portions 40a of the cover member 40 with the rubber sheet 38.

The rubber sheet 38 returns to a previous state owing to its elasticity, when contacting.

The power generating device 36 is capable of generating power using both human body movements and robotic movements.

The above-described power generating devices in accordance with some embodiments of the present invention can effectively utilize expanding/contracting movements, such as bending, stretching, and linear reciprocating movements, caused in the human body or environment, as power generating energy sources.

Materials used for the power generating devices in accordance with some embodiments of the present invention are described in detail below.

First Electrode and Second Electrode

The first electrode 5 or 28 and the second electrode 6 or 30 are not limited in material, shape, size, and structure.

The first electrode 5 or 28 and the second electrode 6 or 30 are either common or different in material, shape, size, and/or structure. Preferably, the first electrode 5 or 28 and the second electrode 6 or 30 are common in these properties.

Specific examples of materials used for the first electrode 5 or 28 and the second electrode 6 or 30 include, but are not limited to, metals, carbon-based conductive materials, and conductive rubber compositions.

Specific examples of the metals include, but are not limited to, gold, silver, copper, aluminum, stainless steel, tantalum, nickel, and phosphor bronze. Specific examples of the carbon-based conductive materials include, carbon nanotube, carbon fibers, and graphite. Specific examples of the conductive rubber compositions include, but are not limited to, a composition including a conductive filler and a rubber.

Specific examples of the conductive filler include, but are not limited to, carbon materials (e.g., Ketjen black, acetylene black, graphite, carbon fiber (CF), carbon nanofiber (CNF), carbon nanotube (CNT), graphene), metal fillers (e.g., gold, silver, platinum, copper, aluminum, nickel), conductive polymeric materials (e.g., derivatives of polythiophene, polyacetylene, polyaniline, polypyrrole, polyparaphenylene, or polyparaphenylene vinylene, to which a dopant, such as anion and cation, may be added), and ionic liquids. Each of these materials can be used alone or in combination with others.

Specific examples of the rubber include, but are not limited to, silicone rubber, modified silicone rubber, acrylic rubber, chloroprene rubber, polysulfide rubber, urethane rubber, isobutyl rubber, fluorosilicone rubber, ethylene rubber, natural rubber (latex), ethylene propylene rubber, nitrile rubber, and fluorine rubber. Each of these materials can be used alone or in combination with others.

The first electrode 5 or 28 and the second electrode 6 or 30 may be in the form of a thin film. The first electrode 5 or 28 and the second electrode 6 or 30 may be made of woven fabric, non-woven fabric, knit fabric, mesh, sponge, or non-woven fabric formed by layering fibrous carbon materials.

Preferably, the first electrode 5 or 28 and the second electrode 6 or 30 have an average thickness in the range of from 0.01 μm to 1 mm, more preferably from 0.1 to 500 μm, from the aspect of conductivity and flexibility. When the average thickness is 0.01 μm or more, mechanical strength becomes appropriate and conductivity improves. When the average thickness is 1 mm or less, the element becomes deformable, thus providing good power generation performance.

Intermediate Layer

The intermediate layer 4 has flexibility.

The intermediate layer 4 satisfies at least one of the following conditions (1) and (2).

Condition (1): When a pressure is applied to the intermediate layer 4 from a direction perpendicular to the plane of the intermediate layer 4, the amount of deformation of a first side of the intermediate layer 4 facing the first electrode 5 or 28 and that of a second side of the intermediate layer 4 facing the second electrode 6 or 30 are different.

Condition (2): The universal hardness (H1) of the first side of the intermediate layer 4 facing the first electrode 5 or 28 and the universal hardness (H2) of the second side of the intermediate layer 4 facing the second electrode 6 or 30 are different, when the indentation depth is 10 μm.

As the amount of deformation or the hardness is different between both sides of the intermediate layer 4, a large amount of power can be generated.

Here, the amount of deformation is defined as the maximum indentation depth of an indenter, when the indenter is pressed against the intermediate layer 4 under the following conditions.

Measurement Conditions

Measuring instrument: Microhardness tester WIN-HUD available from Fischer

Indenter: Quadrangular diamond indenter having a facing angle of 136°

Initial load: 0.02 mN

Maximum load: 1 mN

Load increasing time from initial load to maximum load: 10 seconds

The universal hardness is measured under the following conditions.

Measurement Conditions

Measuring instrument: Microhardness tester WIN-HUD available from Fischer

Indenter: Quadrangular diamond indenter having a facing angle of 136°

Indentation depth: 10 μm

Initial load: 0.02 mN

Maximum load: 100 mN

Load increasing time from initial load to maximum load: 50 seconds

The ratio (H1/H2) of the universal hardness (H1) to the universal hardness (H2) is preferably 1.01 or more, more preferably 1.07 or more, and most preferably 1.13 or more. The upper limit of the ratio (H1/H2) is variable according to the degree of flexibility required by the use condition and/or the load applied in the use condition. However, the ratio (H1/H2) is preferably 1.70 or less. The universal hardness (H1) is a hardness of a relatively hard surface. The universal hardness (H2) is a hardness of a relatively soft surface.

Specific examples of materials used for the intermediate layer 4 include, but are not limited to, rubbers and rubber compositions. Specific examples of the rubbers include, but are not limited to, silicone rubber, fluorosilicone rubber, acrylic rubber, chloroprene rubber, natural rubber (latex), urethane rubber, fluorine rubber, and ethylene propylene rubber. Each of these materials can be used alone or in combination with others. Among these rubbers, silicone rubber is preferable.

The silicone rubber is not limited in structure so long as organosiloxane bonds are included. Specific examples of the silicone rubber include, but are not limited to, dimethyl silicone rubber, methyl phenyl silicone rubber, modified (e.g., acrylic-modified, alkyd-modified, ester-modified, epoxy-modified) silicone rubber. Each of these materials can be used alone or in combination with others.

Specific examples of the rubber compositions include, but are not limited to, a composition including a filler and at least one of the above-described rubbers. Among these rubber compositions, a silicone rubber composition including the above-described silicone rubbers is preferable.

The filler may be either an organic filler, an inorganic filler, or an organic-inorganic composite filler. Any organic compounds can be used as the organic filler. Specific examples of the organic filler include, but are not limited to, fine particles of acrylic resin, melamine resin, or fluororesin (e.g., polytetrafluoroethylene), silicone powder (e.g., silicone resin powder, silicone rubber powder, silicone composite powder), rubber powder, wood powder, pulp, and starch. Any inorganic compounds can be used as the inorganic filler.

Specific examples of the inorganic filler include, but are not limited to, oxides, hydroxides, carbonates, sulfates, silicates, nitrides, carbons, metals, and other compounds.

Specific examples of the oxides include, but are not limited to, silica, diatom earth, alumina, zinc oxide, titanium oxide, iron oxide, and magnesium oxide.

Specific examples of the hydroxides include, but are not limited to, aluminum hydroxide, calcium hydroxide, and magnesium hydroxide.

Specific examples of the carbonates include, but are not limited to, calcium carbonate, magnesium carbonate, barium carbonate, and hydrotalcite.

Specific examples of the sulfates include, but are not limited to, aluminum sulfate, calcium sulfate, and barium sulfate.

Specific examples of the silicates include, but are not limited to, calcium silicate (e.g., wollastonite, xonotlite), zirconia silicate, kaolin, talc, mica, zeolite, pearlite, bentonite, montmorillonite, sericite, activated clay, glass, and hollow glass beads.

Specific examples of the nitrides include, but are not limited to, aluminum nitride, silicon nitride, and boron nitride.

Specific examples of the carbons include, but are not limited to, Ketjen black, acetylene black, graphite, carbon fiber, carbon nanofiber, carbon nanotube, fullerene (and derivatives thereof), and graphene.

Specific examples of the metals include, but are not limited to, gold, silver, platinum, copper, iron, aluminum, and nickel.

Specific examples of the other compounds include, but are not limited to, potassium titanate, barium titanate, strontium titanate, lead zirconate titanate, silicon carbide, and molybdenum sulfide. The inorganic filler may be surface-treated.

As the organic-inorganic composite filler, a compound in which an organic compound and an inorganic compound are combined on the molecular level may be used.

Specific examples of the organic-inorganic composite filler include, but are not limited to, silica-acrylic composite particles and silsesquioxane.

The filler preferably has an average particle diameter in the range of from 0.01 to 30 μm, more preferably from 0.1 to 10 μm. When the average particle diameter is 0.01 μm or more, power generation performance may be improved. When the average particle diameter is 30 μm or less, the intermediate layer 4 becomes deformable, thus improving power generation performance.

The average particle diameter can be measured by a known particle size distribution analyzer, such as MICROTRACK HRA (available from Nikkiso Co., Ltd.), by a known method.

The content of the filler in the rubber composition is preferably in the range of from 0.1 to 100 parts by mass, more preferably from 1 to 50 parts by mass, based on 100 parts by mass of the rubber. When the content is 0.1 parts by mass or more, power generation performance may be improved. When the content is 100 parts by mass or less, the intermediate layer 4 becomes deformable, thus improving power generation performance.

The rubber composition may further include other components, such as an additive. The contents of the other components may be appropriately determined so long as the effect of the present invention is not damaged.

Specific examples of the additive include, but are not limited to, a cross-linker, a deterioration preventer, a heat resistant agent, and a colorant.

Materials used for the intermediate layer 4 may be prepared by any known method. For example, the rubber composition may be prepared by mixing the rubber, the filler, and other optional components, and kneading the mixture.

The intermediate layer 4 may be formed by any known method. For example, a thin layer of the rubber composition may be formed by hardening the rubber composition, coated on a substrate by means of blade coating, die coating, or dip coating, with heat or electron beam.

The intermediate layer 4 preferably has an average thickness in the range of from 1 μm to 10 mm, more preferably from 20 μm to 1 mm, from the aspect of deformation following property. When the average thickness is within the above preferable range, the intermediate layer 4 can exhibit sufficient film formation property without inhibiting deformation property, thus providing good power generation performance.

Preferably, the intermediate layer 4 has insulation property. More specifically, the intermediate layer 4 preferably has a volume resistivity of $10^8$ Ωcm or more, more preferably $10^{10}$ Ωcm or more. The intermediate layer 4 may have a multi-layered structure.

Surface Modification Treatment and Inactivation Treatment

As methods for making both sides of the intermediate layer 4 different in the amount of deformation or hardness, a surface modification treatment and/or an inactivation treatment may be employed. Such treatments may be performed for either both sides or one side of the intermediate layer 4.

Surface Modification Treatment

Specific examples of the surface modification treatment include, but are not limited to, plasma treatment, corona discharge treatment, electron irradiation treatment, ultraviolet irradiation treatment, ozone treatment, and radiation (e.g., X-ray, α-ray, β-ray, γ-ray, neutron ray) irradiation treatment. From the aspect of processing speed, plasma treatment, corona discharge treatment, and electron irradiation treatment are preferable. The surface modification treatment is not limited to any particular treatment so long as a certain degree of irradiation energy is sufficiently provided to modify a material.

Plasma Treatment

Plasma generators for use in the plasma treatment may be of parallel plate type, capacitive coupling type, or inductive coupling type. In addition, atmospheric pressure plasma generators may also be used for the plasma treatment. In particular, a reduced-pressure plasma treatment is preferable from the aspect of durability.

The reaction pressure in the plasma treatment is preferably in the range of from 0.05 to 100 Pa, and more preferably from 1 to 20 Pa.

As the reaction atmosphere in the plasma treatment, inert gas, rare gas, and oxygen gas are suitable. In particular, argon is preferable from the aspect of persistence of the effect.

The reaction atmosphere preferably has an oxygen partial pressure of 5,000 ppm or less. When the reaction atmosphere has an oxygen partial pressure of 5,000 ppm or less, generation of ozone is suppressed and the use of an ozone treatment equipment is reduced.

In the plasma treatment, the amount of irradiation electric energy, defined by the product of output and irradiation time, is preferably in the range of from 5 to 200 Wh, more preferably from 10 to 50 Wh. When the amount of irradiation electric energy is within the above preferable range, the intermediate layer 4 is given a power generation function without degrading durability by excessive irradiation.

Corona Discharge Treatment

In the corona discharge treatment, the amount of applied (accumulated) energy is preferably in the range of from 6 to 300 J/cm², more preferably from 12 to 60 J/cm². When the amount of applied energy is within the above preferable range, the intermediate layer 4 is given a power generation function without degrading durability by excessive irradiation.

Electron Irradiation Treatment

In the electron irradiation treatment, the irradiation amount is preferably 1 kGy or more, and more preferably in the range of from 300 kGy to 10 MGy. When the irradiation amount is within the above preferable range, the intermediate layer 4 is given a power generation function without degrading durability by excessive irradiation.

As the reaction atmosphere in the electron irradiation treatment, an inert gas (e.g., argon gas, neon gas, helium gas, nitrogen gas) having an oxygen partial pressure of 5,000 ppm or less is preferable. When the reaction atmosphere has an oxygen partial pressure of 5,000 ppm or less, generation of ozone is suppressed and the use of an ozone treatment equipment is reduced.

Ultraviolet Irradiation Treatment

In the ultraviolet irradiation treatment, the ultraviolet ray preferably has a wavelength of from 200 to 365 nm, more preferably from 240 to 320 nm.

In the ultraviolet irradiation treatment, the accumulated amount of light is preferably in the range of from 5 to 500 J/cm², more preferably from 50 to 400 J/cm². When the accumulated amount of light is within the above preferable range, the intermediate layer 4 is given a power generation function without degrading durability by excessive irradiation.

As the reaction atmosphere in the ultraviolet irradiation treatment, an inert gas (e.g., argon gas, neon gas, helium gas, nitrogen gas) having an oxygen partial pressure of 5,000 ppm or less is preferable. When the reaction atmosphere has an oxygen partial pressure of 5,000 ppm or less, generation of ozone is suppressed and the use of an ozone treatment equipment is reduced.

There is a conventional technology for improving an interlayer adhesion force by forming active groups by means of excitation or oxidization caused by a plasma treatment, corona discharge treatment, ultraviolet irradiation treatment, or electron irradiation treatment. However, such a technology has a limited application to improvement of interlayer adhesion force. It is known that application of that technology to outermost surface modification treatments causes a significant deterioration in releasability of the outermost surface, which is not preferable. Moreover, in that technology, a reactive active group (e.g., hydroxyl group) is efficiently introduced under an oxygen-rich reaction condition. That conventional technology is essentially different from the surface modification treatments in accordance with some embodiments of the present invention.

The plasma treatment, as an example of the surface modification treatment in accordance with some embodiments of the present invention, is performed under a reduced-pressure environment with a small amount of oxygen. Such a plasma treatment accelerates re-cross-linkage or recombination of the surface and increases the number of Si—O bonds having a high bond energy, improving the durability of the surface.

In addition, since the surface is densified owing to the increased cross linkage density, the releasability of the surface is also improved. Although active groups are formed in part, such active groups are inactivated by a coupling agent or an air drying treatment.

Inactivation Treatment

The surface of the intermediate layer 4 may be subjected to an inactivation treatment using any material.

The inactivation treatment is not limited to any particular process so long as the surface of the intermediate layer 4 is inactivated. For example, the inactivation treatment may include imparting an inactivator to the surface of the intermediate layer 4. Here, inactivation of the intermediate layer 4 refers to a phenomenon in which the nature of the surface of the intermediate layer 4 is changed to have less chemical reactivity. Specifically, the degree of activity of the surface of the intermediate layer 4 is reduced by reacting the surface with an inactivator with active groups (e.g., —OH groups) generated by excitation or oxidization caused by a plasma treatment, corona discharge treatment, ultraviolet irradiation treatment, or electron irradiation treatment.

Specific examples of the inactivator include, but are not limited to, an amorphous resin and a coupling agent. Specific examples of the amorphous resin include, but are not limited to a resin having a perfluoropolyether structure in its main backbone.

Specific examples of the coupling agent include, but are not limited to, a metal alkoxide, and a solution containing a metal alkoxide.

Specific examples of the metal alkoxide include, but are not limited to, a compound represented by the following formula (1), a partially-hydrolyzed polycondensate thereof having a polymerization degree of about 2 to 10, and a mixture thereof.

$$R^1_{(4-n)}Si(OR^2)_n \quad (1)$$

In the formula (1), each of $R^1$ and $R^2$ independently represents a straight-chain or branched-chain alkyl group having 1 to 10 carbon atoms, an alkyl polyether chain, or an aryl group; and n represents an integer of from 2 to 4.

The inactivation treatment may be performed by, for example, subjecting a precursor (e.g., rubber) of the intermediate layer 4 to the surface modification treatment first, and then coating or impregnating (e.g., by means of dipping) the surface of the precursor of the intermediate layer 4 with an inactivator.

When a silicone rubber is used as the precursor of the intermediate layer 4, the silicone rubber may be subjected to the surface modification treatment first, and then left at rest in the air to be inactivated through air drying.

Preferably, the oxygen concentration profile of the intermediate layer 4 has a local maximum value in the thickness direction. Preferably, the carbon concentration profile of the intermediate layer 4 has a local minimum value in the thickness direction.

Preferably, in the intermediate layer 4, a position which indicates a local maximum value in the oxygen concentration profile is coincident with a position which indicates a local minimum value in the carbon concentration profile.

The oxygen concentration profile and the carbon concentration profile can be determined by X-ray photoelectron spectroscopy (XPS).

Measurement Conditions
  Measurement Device: ULVAC-PHI QUANTERA SXM available from ULVAC-PHI, Inc.
  Measurement Light Source: Al (mono)
  Measurement Output: 100 μm φ, 25.1 W
  Measurement Area: 500 μm×300 μm
  Pass Energy: 55 eV (narrow scan)
  Energy Step: 0.1 eV (narrow scan)
  Relative Sensitivity Factor: Relative sensitivity factor of PHI is used
  Sputter Source: C60 Cluster ion
  Ion Gun Output: 10 kV, 10 nA
  Raster Control: (X=0.5, Y=2.0) mm
  Sputter Rate: 0.9 nm/min ($SiO_2$ conversion)

XPS analyzes atomic composition and binding state of a target object by capturing electrons which escaped from the target object by the photoelectron effect.

Silicone rubbers have siloxane bonds. The major components of silicone rubbers include Si, O, and C. In a case in which the intermediate layer 4 is formed of a silicone rubber, the atomic composition of the intermediate layer 4 in the depth direction, in other words, the atomic concentration (%) distribution of the major atoms (Si, O, or C) ranging from the surface part to the inner part of the intermediate layer 4, can be determined from a relative peak strength ratio in a wide scan spectrum measured by XPS. One example of the wide scan spectrum is illustrated in FIG. 9.

Figure 9:
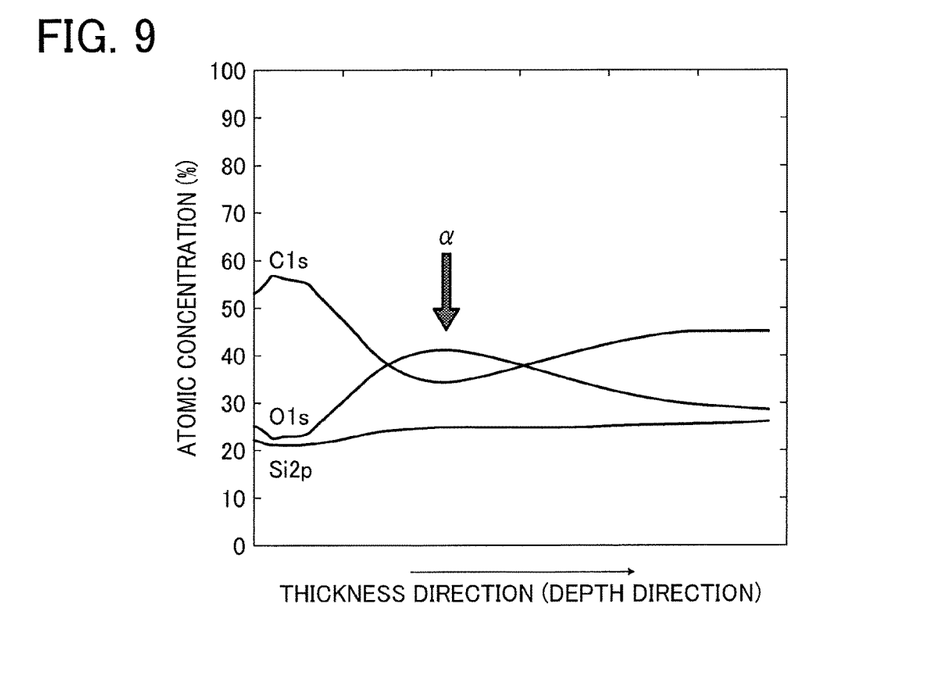
FIG. 9 is an XPS (X-ray photoelectron spectroscopy) chart of a surface-modified inactivated intermediate layer, formed of a silicone rubber, of a power generating device according to an embodiment of the present invention.

The spectrum illustrated in FIG. 9 is measured with one sample of the intermediate layer 4 which is prepared by subjecting a silicone rubber to the above-described plasma treatment (as the surface modification treatment) and the above-described inactivation treatment. In FIG. 9, the horizontal axis represents the analysis depth measured from the surface part toward the inner part, and the vertical axis represents the atomic concentration (%).

In the case of a silicone rubber, elements bound to silicon atoms and the binding state thereof can be determined by measuring the energy of electrons escaped form the Si2p orbit. Specifically, by separating peaks in a narrow scan spectrum of the Si2p orbit, which indicates binding state of Si, a chemical binding state of Si can be determined.

Figure 10:
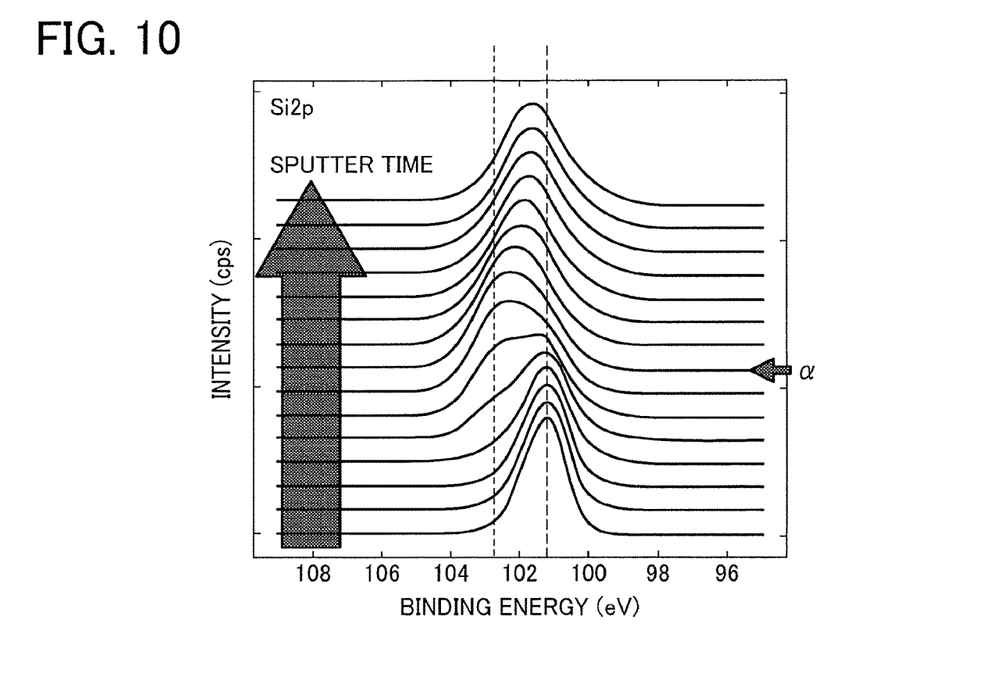
FIG. 10 is a graph showing a variation in the Si2p binding energy of the intermediate layer used to obtain the chart of FIG. 9 in the thickness direction.

The result of peak separation is illustrated in FIG. 10. The graph illustrated in FIG. 10 was measured with the same sample of the intermediate layer 4 used to obtain the chart of FIG. 9. In FIG. 10, the horizontal axis represents binding energy, and the vertical axis represents intensity. Each curve represents a spectrum measured at each depth. A spectrum on a lower side indicates a greater (deeper) measurement depth.

It is generally known that the amount of peak shift depends on the binding state. In the case of the silicone rubber according to the present embodiment, the peak is shifted toward a high-energy side with respect to the Si2p orbit. This indicates that the amount of oxygen atoms bound to Si has been increased.

As the silicone rubber is subjected to the surface modification treatment and the inactivation treatment, the amount of oxygen is increased from the surface part toward the inner part while exhibiting a local maximum value, while the amount of carbon is decreased while exhibiting a local minimum value. As the silicone rubber is further analyzed in the depth direction, the amount of oxygen is decreased and the amount of carbon is increased to have the same atomic composition as an untreated silicone rubber.

The fact that the local maximum value in the oxygen concentration profile is detected at the position a in FIG. 9 is coincident with the fact that the Si2p binding energy is shifted to a high-energy side (as indicated by a in FIG. 10). This indicates that an increase of oxygen atoms is detected from the number of oxygen atoms bound to Si.

Figure 11:
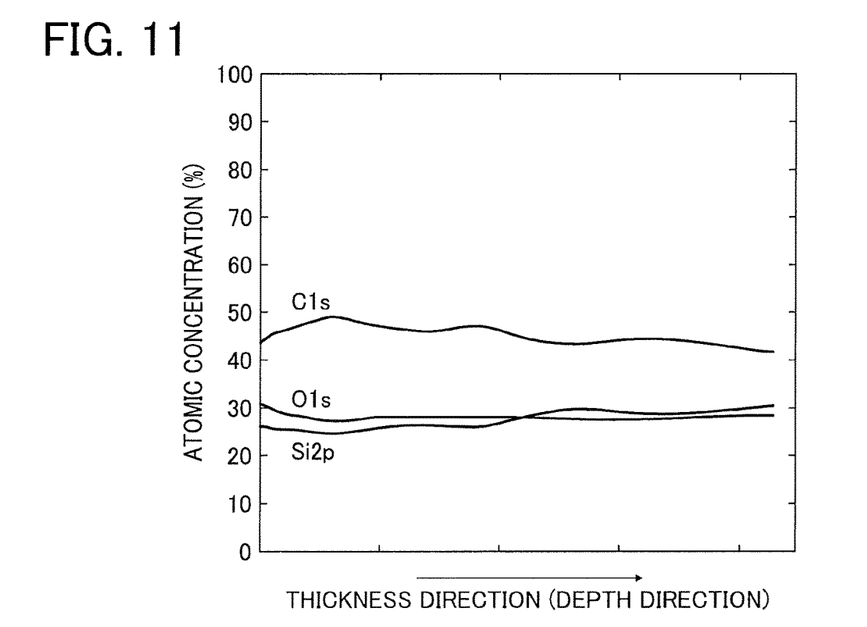
FIG. 11 is an XPS chart of an untreated intermediate layer, formed of a silicone rubber.
Figure 12:
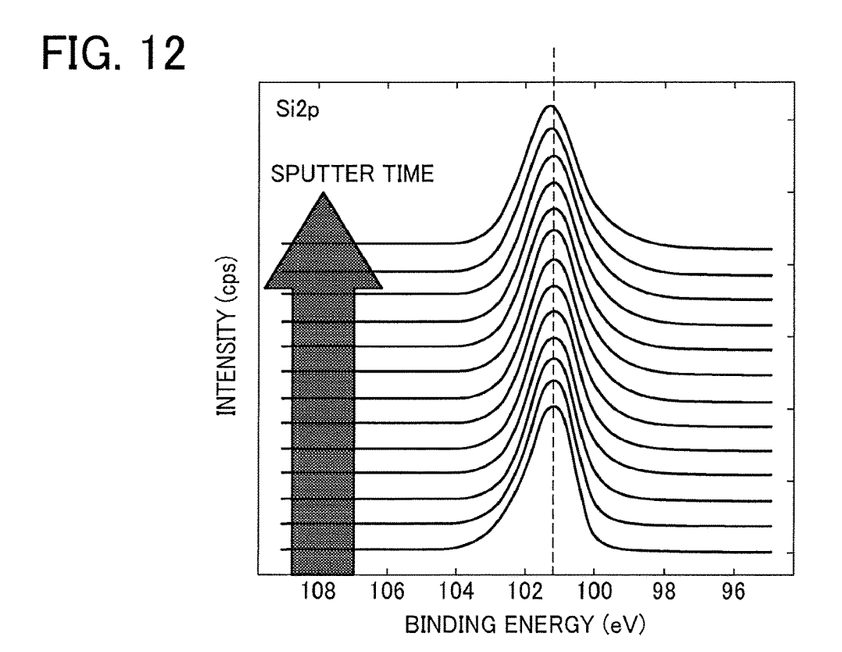
FIG. 12 is a graph showing a variation in the Si2p binding energy of the intermediate layer used to obtain the chart of FIG. 11 in the thickness direction.

FIGS. 11 and 12 present results for an untreated silicone rubber with respect to the same analysis performed to obtain graphs of FIGS. 9 and 10, respectively.

In FIG. 11, no local maximum value is observed in the oxygen concentration profile, and no local minimum value is observed in the carbon concentration profile, in contrast to FIG. 9. In addition, in FIG. 12, the Si2p binding energy is not shifted to a high-energy side. This indicates that the number of oxygen atoms bound to Si has not been changed.

As the surface of the intermediate layer 4 is coated or impregnated (e.g., by means of dipping) with the inactivator (e.g., a coupling agent), the inactivator gradually penetrates the intermediate layer 4. In a case in which the coupling agent is the compound represented by the formula (1), polyorganosiloxane will be distributed within the intermediate layer 4. The concentration distribution of oxygen atoms included in the polyorganosiloxane will exhibit a local maximum value in the depth direction.

As a result, the intermediate layer 4 comes to include polyorganosiloxane containing silicon atoms bound to 3 to 4 oxygen atoms.

The inactivation treatment is not limited to dipping, so long as oxygen atoms included in polyorganosiloxane are distributed such that the concentration distribution thereof exhibits a local maximum value in the depth direction (thickness direction). Specific examples of the inactivation treatment include, but are not limited to, plasma CVD (chemical vapor deposition), PVD (physical vapor deposition), sputtering, vacuum deposition, and combustion chemical vapor deposition.

The intermediate layer 4 need not necessarily have an initial surface potential at rest. The initial surface potential at rest can be measured under the conditions described below. Here, having no initial surface potential refers to having an initial surface potential of ±10 V or less, when measured under the following conditions.

Measurement Conditions

Pretreatment: Left at rest in an atmosphere having a temperature of 30° C. and a relative humidity of 40% for 24 hours and subjected to a neutralization for 60 seconds (using an instrument SJ-F300 available from Keyence Corporation).

Instrument: Treck Model 344
Measurement Probe: 6000B-7C
Measurement Distance: 2 mm
Measurement Spot Diameter: 10 mm Within the element according to the present embodiment, a bias in capacitance is caused upon a charging, the mechanism of which is similar to triboelectric charging, and a generation of surface potential difference due to inner charge retention, according to the difference in deformation amount between both sides of the intermediate layer 4 that is caused by the difference in hardness therebetween. It is considered that such a bias in capacitance causes charge transfer and further causes power generation.

Preferably, a space is provided between the intermediate layer 4 and at least one of the first electrode 5 or 28 and the second electrode 6 or 30, to increase the amount of power generation.

For example, such a space can be provided by disposing a spacer between the intermediate layer 4 and at least one of the first electrode 5 or 28 and the second electrode 6 or 30.

The spacer is not limited in material, configuration, shape, and size. Specific examples of materials used for the spacer include, but are not limited to, polymeric materials, rubbers, metals, conductive polymeric materials, and conductive rubber compositions.

Specific examples of the polymeric materials include, but are not limited to, polyethylene, polypropylene, polyethylene terephthalate, polyvinyl chloride, polyimide resin, fluororesin, and acrylic resin. Specific examples of the rubber include, but are not limited to, silicone rubber, modified silicone rubber, acrylic rubber, chloroprene rubber, polysulfide rubber, urethane rubber, isobutyl rubber, fluorosilicone rubber, ethylene rubber, and natural rubber (latex).

Specific examples of the metals include, but are not limited to, gold, silver, copper, aluminum, stainless steel, tantalum, nickel, and phosphor bronze. Specific examples of the conductive polymeric materials include, but are not limited to, polythiophene, polyacetylene, and polyaniline. Specific examples of the conductive rubber compositions include, but are not limited to, a composition including a conductive filler and a rubber. Specific examples of the conductive filler include, but are not limited to, carbon materials (e.g., Ketjen black, acetylene black, graphite, carbon fiber, carbon nanofiber, carbon nanotube, graphene), metal fillers (e.g., gold, silver, platinum, copper, iron, aluminum, nickel), conductive polymeric materials (e.g., derivatives of polythiophene, polyacetylene, polyaniline, polypyrrole, polyparaphenylene, or polyparaphenylene vinylene, to which a dopant, such as anion and cation, may be added), and ionic liquids.

Specific examples of the rubber include, but are not limited to, silicone rubber, modified silicone rubber, acrylic rubber, chloroprene rubber, polysulfide rubber, urethane rubber, isobutyl rubber, fluorosilicone rubber, ethylene rubber, and natural rubber (latex).

The spacer may be in the form of a sheet, film, woven fabric, non-woven fabric, mesh, or sponge.

The shape, size, thickness, and installation location of the spacer are appropriately determined according to the structure of the element.

Figure 13:
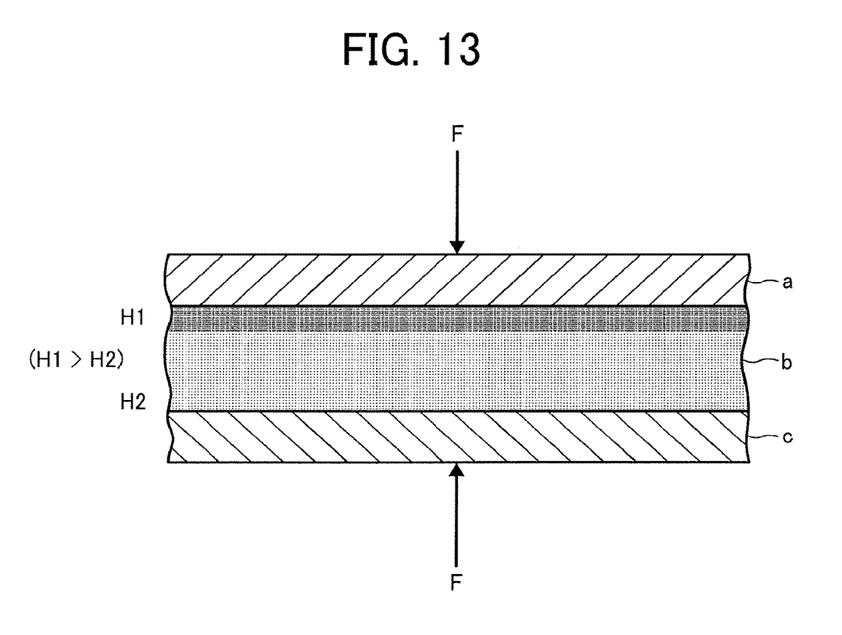
FIG. 13 is a cross-sectional view of an element including a surface-modified inactivated intermediate layer according to an embodiment of the present invention.

In the embodiment illustrated in FIG. 13, the first electrode 5 or 28, the intermediate layer 4, and the second electrode 6 or 30 are indicated by symbols a, b, and c, respectively. In a case in which one side of the intermediate layer b which faces the first electrode a is subjected to the surface modification treatment or the inactivation treatment, the universal hardness H1 of that side of the intermediate layer b which faces the first electrode a becomes greater than the universal hardness H2 of the other side of the intermediate layer b which faces the second electrode c.

When a pressing force F is respectively applied to both sides of the intermediate layer b, the degree of deformation of one side of the intermediate layer b facing the first electrode a becomes smaller than that of the other side of the intermediate layer b facing the second electrode c.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A power generating element comprising:
 a piezoelectric body being expandable and contractible in response to a movement of a moving body, that undergoes a deformation when expanding or contracting and generates power when undergoing the deformation;
 a pair of electrodes that extracts the power generated as the piezoelectric body undergoes the deformation,
  wherein the piezoelectric body reversibly transitions between a first shape and a second shape different from the first shape, as the piezoelectric body expands or contracts,
  wherein the piezoelectric body is in one of the first shape and the second shape when the moving body does not act on the power generating element,
  wherein one of the first shape and the second shape is a bent shape, and a flexible cover member having the bent shape,
 wherein the piezoelectric body and the pair of electrodes have flexibility and are supported by the flexible cover member.

2. The power generating element of claim 1, wherein the piezoelectric body is disposed between the electrodes in a thickness direction of the piezoelectric body.

3. The power generating element of claim 2, further comprising a cover member covering outer surfaces of the electrodes, the cover member being deformable along with the deformation of the piezoelectric body.

4. The power generating element of claim 1, wherein the piezoelectric body and the pair of electrodes each include a material being expandable and contractible.

5. The power generating element of claim 1, wherein the piezoelectric body has elasticity which causes the piezoelectric body to transition between the first shape and the second shape.

6. A power generating element comprising:
a piezoelectric body being expandable and contractible in response to a movement of a moving body, that undergoes a deformation when expanding or contracting and generates power when undergoing the deformation;
a pair of electrodes that extracts the power generated as the piezoelectric body undergoes the deformation,
wherein the piezoelectric body reversibly transitions between a first shape and a second shape different from the first shape, as the piezoelectric body expands or contracts,
wherein the piezoelectric body is in one of the first shape and the second shape when the moving body does not act on the power generating element,
wherein one of the first shape and the second shape is a bent shape, an elastic support being expandable and contractible; and
a flexible intermediate support intermittently secured to the elastic support in the direction of expansion or contraction, to have the bent shape,
wherein the piezoelectric body and the pair of electrodes have flexibility and are supported by the flexible intermediate support.

* * * * *